United States Patent [19]

Bunnell

[11] 4,455,460

[45] Jun. 19, 1984

[54] JOYSTICK SWITCH

[75] Inventor: Edward D. Bunnell, Palm Harbor, Fla.

[73] Assignee: AMP Incorporated, Harrisburg, Pa.

[21] Appl. No.: 394,944

[22] Filed: Jul. 2, 1982

[51] Int. Cl.[3] .................... H01H 25/04

[52] U.S. Cl. .................... 200/6 A

[58] Field of Search .................... 200/5 R, 6 A, 17 R, 200/18

[56] References Cited

U.S. PATENT DOCUMENTS 3,898,397 8/1975 Devore et al. .................... 200/6 A 4,315,113 2/1982 Fisher et al. .................... 200/6 A X 4,331,849 5/1982 Wolf .................... 200/61.85

4,364,047 12/1982 Archer .................... 200/6 A X

*Primary Examiner*—J. R. Scott

*Attorney, Agent, or Firm*—F. Brice Faller

[57] ABSTRACT

Joystick switch has a shaft mounted through an elastomeric member in a support fixed to a circuit board. A spring surrounding the shaft between the support member and the board urges a sliding contact plate, carried loosely on the inner end of the shaft, against one or more contacts on the board as a handle on the opposite end of the shaft is moved laterally. Contacts, circuit traces, and pins on the board are die cast zinc.

5 Claims, 5 Drawing Figures

JOYSTICK SWITCH

BACKGROUND OF THE INVENTION

The present invention relates to a joystick switch, a device for generating signals for x-y directional control responsive to pivotal movement of an elongate handle.

Joystick switches are currently enjoying popularity as x-y directional control switches in electronic games found both in commercial environments and in the home in conjunction with television sets. Joystick switches of the prior art generally employ ball and socket type joints and individual switches which are actuated by one end of the joystick in response to movement of the handle end of the stick by the operator's hand. Cam tracks are often employed to direct the end of the joystick to the desired switch and metal springs are often employed to effect return of the handle. Known joystick assembly schemes are often complex in structure and time-consuming and expensive to manufacture. U.S. Pat. No. 3,898,397 discloses a simplified joystick having a shaft mounted through an elastomeric member in a face plate mounted on an open end of the housing. Pivoting the shaft causes a contact plate fixed on the inner end of the shaft to bridge between a central contact and at least one of a plurality of contacts mounted on the inner surface of the housing.

SUMMARY OF THE INVENTION

The present invention is directed to a joystick switch which is inexpensive to manufacture, employs a minimum of parts, and is simple to assemble. The joystick switch employs an actuating assembly mounted on a circuit board having contacts which are bridged when the handle is pivoted. Return action is provided by an elastomeric member through which the handle is mounted. The contacts and associated circuitry are preferably die cast zinc. The simplicity of design makes the joystick quite durable and resistant to breakage.

DETAILED DESCRIPTION OF THE PREFERRED EMBODIMENT

Figure 1:
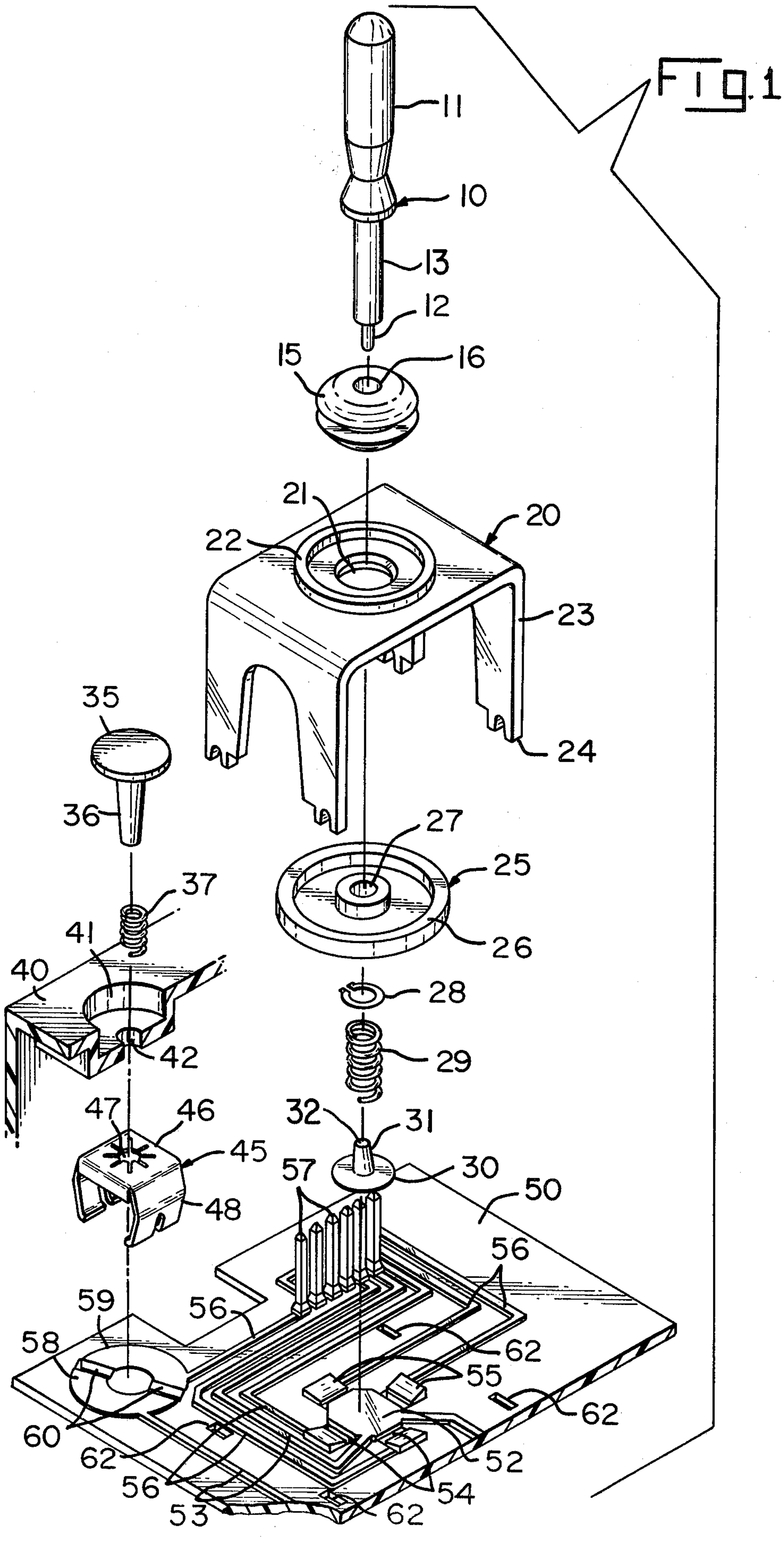
FIG. 1 is an exploded perspective of the joystick switch.

FIG. 1 depicts the components of the joystick switch of the present invention prior to assembly. An actuating assembly comprises a shaft 10, an elastomeric member or grommet 15, a stop member 25, snap ring 28, spring 29, and contact plate 30. This is assembled by fitting the elastomeric member 15 into an aperture 21 in a support member or bridge 20, sliding shaft portion 13 of the shaft 10 through hole 16 in the grommet 15 until the handle 11 of the shaft 10 abuts the grommet 15, inserting inner end or nose 12 of the shaft 10 through hole 27 in stop member 25 until the stop member 25 abuts the grommet 15, and locking member 25 in place by fixing snap ring 28 to the shaft 10. Spring 29 is then fit onto shaft portion 13 against the snap ring 28, contact plate 30 is placed on ground pad 52 of circuit board 50, and the legs 23 of bridge 20 are placed against the board 50 so that tabs 24 fit into apertures 62 in the board and the nose 12 fits into aperture 32 in the top of tubular standoff 31 of the contact plate 30. The tabs 24 are then bent outward to lock the bridge 20 to the board 50.

Referring still to FIG. 1, the circuit board 50 employs die cast zinc circuit traces and contact elements which include the ground pad 52 and four surrounding signal contacts or pads 55, which are separated from the ground pad 52 by apertures 54. The signal pads 55 are each connected to one of pins 57 by a signal trace 56 while the ground pad 52 is connected to a pin 57 by a ground trace 53. Also cast on the board are firing button ground pad 58 and firing button signal pad 59, which are separated by apertures 60 in the board 50. Pads 58, 59 are electrically engaged by push button contact 46 and may be used for any auxiliary function of the apparatus in which the joystick switch is employed.

FIG. 1 depicts housing 40 in fragmentary section showing recess 41 which is used to mount the firing button 35 by inserting shank 36 through coil spring 37, through hole 42 in recess 41, and into aperture 47 defined by radially surrounding fingers 46 to fix the shank to the push button contact 45. The contact 45 carries legs 48 which bridge the pads 58, 59 when the button 35 is depressed.

Figure 2:
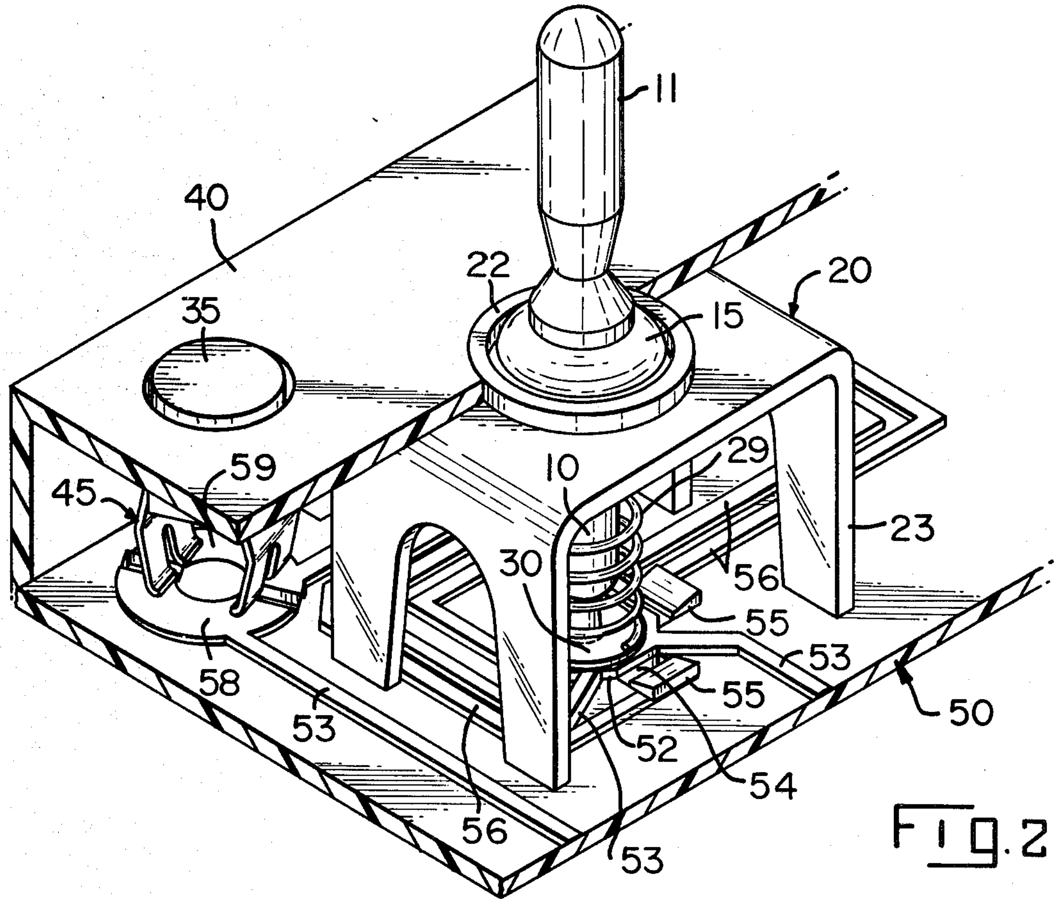
FIG. 2 is a perspective of the assembled joystick switch.

The operation of the assembled joystick switch will be apparent on examining FIG. 2, where housing 40 is shown cut away for clarity. Rim 22 on bridge 20 serves to help position the housing 40 as well as limiting lateral expansion of grommet 15. The shaft 10 is shown normal to the board 50, in which position the contact plate 30 is centered on the ground pad 52 as the switch is in the open position. The elastomeric member 15 urges the shaft 10 to this position unless the handle 10 is moved laterally. Note that contacts 55 are spaced so that plate 30 may engage two contacts 55 simultaneously with ground pad 52; this makes possible eight different signal combinations as either one or two contacts 55 are engaged. The spacing may be altered where it is desired to limit the switch to four signal outputs.

Figure 3:
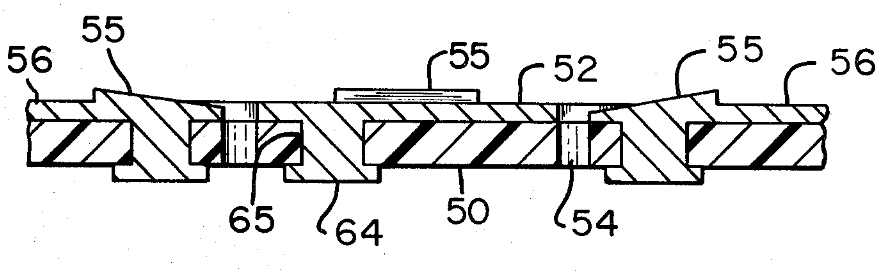
FIG. 3 is a cross section of the circuit board.

FIG. 3 shows details of the ground pad 52 and signal pads 55 in cross section taken through board 50. Studs 64 cast through apertures 65 in the board retain the pads 52, 55 and traces 56 to the board 50.

Figure 4:
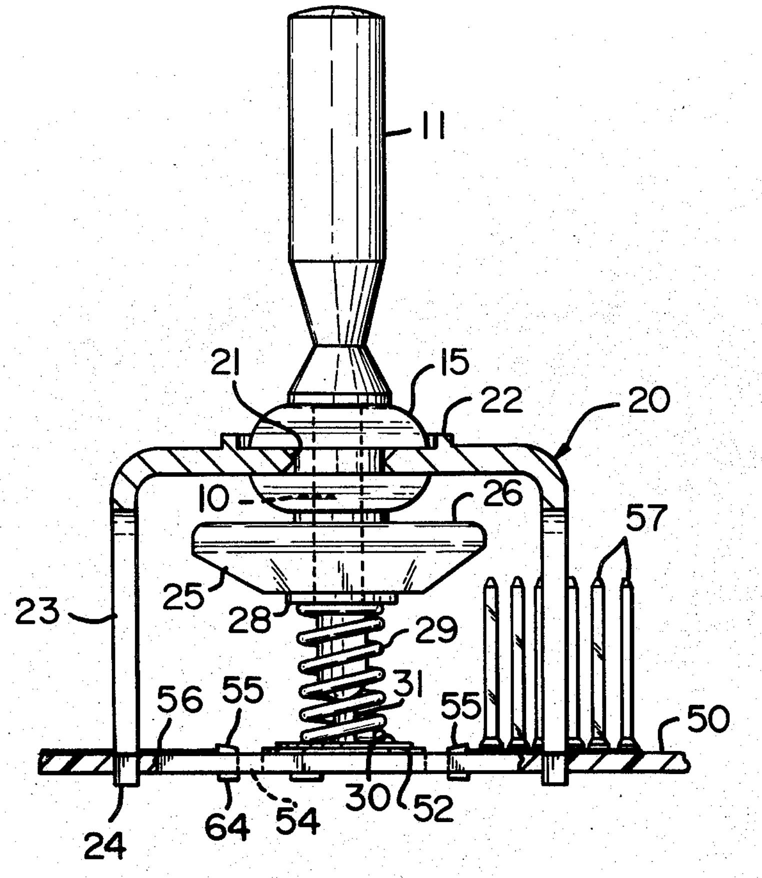
FIG. 4 is a side view of the switch in the normal or open position.

FIG. 4 is a side view of the joystick switch in the open position with the bridge 20 shown in section. Circumferential surface 26 of stop member 25 is uniformly spaced from bridge 20 when the shaft 10 is normal to the board 50 and the elastomeric member 15 maintains the shaft in this position unless the handle 11 is moved laterally. Spring 28 maintains the plate 30 in contact with ground pad 52. Pins 57 which, like other circuit elements are preferably die cast zinc, serve as inputs/outputs for a connector having sockets therein which is wired to provide electrical signals for x-y directional movement of a game piece or similar entity, as well as signals for any auxiliary functions such as the firing button previously described (FIGS. 1 and 2).

Figure 5:
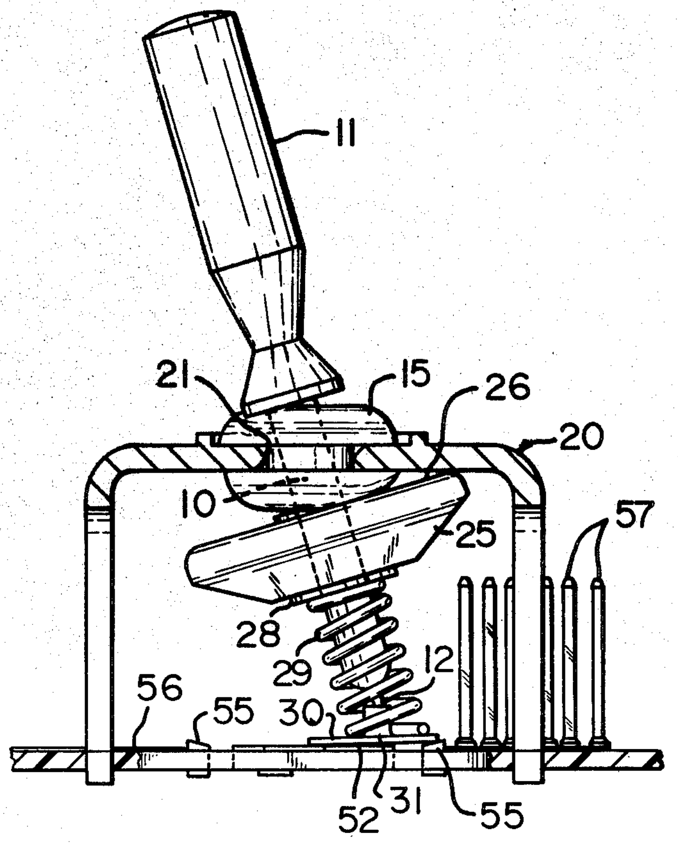
FIG. 5 is a side view of the switch in the dynamic or closed position.

FIG. 5 is a side view of the joystick switch in the closed position. Lateral movement of handle 11 has caused the shaft 10 to pivot about a point within aperture 21 in the bridge 20 until movement is limited by circumferential surface 26 of stop member 25 abutting the bridge 20. Since the pivotal movement of shaft 10 causes inner end or nose 12 to move arcuately away from board 50, it is important that the nose 12 fit loosely in tubular stand-off 31 on the contact plate 30 so that spring 28 will urge the plate 30 into engagement with both the ground pad 52 and a signal contact 55. The signal contact 55 cants upward from the level of pad 52 so that the plate 30 will be urged into positive engagement with both pad 52 and contact 55 regardless of surface wear on the contact 55. Note that elastomeric member 15 is deformed by handle 10, stop member 25, and shaft 10 passing therethrough so that the shaft 10 will be urged resiliently back to a normal position relative to board 50 when the handle 11 is released.

The above description is exemplary and not intended to limit the scope of the claims which follow.

I claim:

1. A joystick switch assembly comprising:

a board member having a conductive ground pad situated thereon and a plurality of conductive signal contacts thereon situated radially about said ground pad and electrically isolated therefrom;

a support member having an aperture therein, said support member being fixed relative to said board member, said aperture being situated about said ground pad;

an actuating assembly comprising a shaft, an elastomeric member, a spring member, and a contact plate, said shaft being mounted in said elastomeric member which in turn is mounted in said aperture of said support means, said shaft having a handle remote from said board and an inner end proximate to said board, said elastomeric member resiliently biasing said shaft to a normal position with respect to said ground pad, said contact plate lying against said ground pad and having a tubular stand-off thereon normal to said plate, said tubular stand-off fitting loosely over said inner end of said shaft said spring member surrounding said shaft between said elastomeric member and said contact plate, said spring member urging said contact plate against said ground pad, whereby, lateral movement of said handle causes said shaft to pivot in said elastomeric member which causes said contact plate to slide across said ground pad until it engages said ground pad and at least one of said signal contacts.

2. A joystick switch as in claim 1 wherein said actuating assembly further comprises a stop member fixed concentrically to said shaft between said elastomeric member and said spring member, said stop member having a circumferential surface lying in a plane normal to the axis of said shaft, said circumferential surface being spaced from said support member when said shaft is in said normal position, said circumferential surface abutting said support member when said shaft is pivoted to a sufficient degree, whereby lateral movement of said handle is limited.

3. A joystick switch as in claim 1 wherein said inner end of said shaft, which fits into said tubular stand-off, is of smaller cross section than the adjacent portion of said shaft.

4. A joystick switch as in claim 1 wherein said ground pad and said signal contacts are cast metal, said cast metal being retained on said board by integral studs passing through said board.

5. A joystick switch as in claim 1 wherein said ground pad is planar and parallel to said board, and said signal contacts slope upward away from said ground pad, whereby said contact plate is pivoted upward by at least one of said signal contact as said handle is moved laterally.

* * * * *